United States Patent
Walston et al.

(10) Patent No.: US 7,733,712 B1
(45) Date of Patent: Jun. 8, 2010

(54) STORAGE SUBSYSTEM WITH EMBEDDED CIRCUIT FOR PROTECTING AGAINST ANOMALIES IN POWER SIGNAL FROM HOST

(75) Inventors: Wesley Walston, Huntington Beach, CA (US); Mark S. Diggs, Laguna Hills, CA (US)

(73) Assignee: Siliconsystems, Inc., Aliso Viejo, CA (US)

( * ) Notice: Subject to any disclaimer, the term of this patent is extended or adjusted under 35 U.S.C. 154(b) by 99 days.

(21) Appl. No.: 12/123,932

(22) Filed: May 20, 2008

(51) Int. Cl.
G11C 7/00 (2006.01)
(52) U.S. Cl. .................. 365/189.11; 365/229; 365/228; 365/189.09; 365/226
(58) Field of Classification Search ............ 365/189.11, 365/189.09, 226, 228, 229
See application file for complete search history.

(56) References Cited

U.S. PATENT DOCUMENTS

| | | | |
|---|---|---|---|
| 5,003,192 A * | 3/1991 | Beigel | 307/140 |
| 5,589,719 A * | 12/1996 | Fiset | 307/131 |
| 5,596,532 A | 1/1997 | Cernea et al. | |
| 5,693,570 A | 12/1997 | Cernea et al. | |
| 5,706,239 A | 1/1998 | Brys | |
| 5,781,473 A | 7/1998 | Javanifard et al. | |
| 5,798,961 A | 8/1998 | Heyden et al. | |
| 5,835,420 A * | 11/1998 | Lee et al. | 365/189.09 |
| 5,873,112 A | 2/1999 | Norman | |
| 5,880,622 A | 3/1999 | Evertt et al. | |
| 6,011,743 A * | 1/2000 | Khang | 365/226 |
| 6,018,700 A * | 1/2000 | Edel | 702/60 |
| 6,038,190 A * | 3/2000 | Kowalski et al. | 365/228 |
| 6,066,902 A * | 5/2000 | Maurio et al. | 307/117 |
| 6,304,467 B1 * | 10/2001 | Nebrigic | 363/49 |
| 6,310,789 B1 * | 10/2001 | Nebrigic et al. | 363/60 |
| 6,424,570 B1 | 7/2002 | Le et al. | |
| 6,515,903 B1 | 2/2003 | Le et al. | |
| 6,532,178 B2 | 3/2003 | Taub | |
| 6,552,933 B2 | 4/2003 | Roohparvar | |
| 6,678,189 B2 | 1/2004 | Tran | |
| 6,687,371 B1 * | 2/2004 | Fischer et al. | 379/399.02 |
| 6,778,665 B1 * | 8/2004 | Fischer et al. | 379/413 |
| 6,798,709 B2 * | 9/2004 | Sim et al. | 365/226 |
| 6,856,556 B1 | 2/2005 | Hajeck | |
| 7,126,857 B2 | 10/2006 | Hajeck | |
| 7,269,755 B2 * | 9/2007 | Moshayedi et al. | 714/2 |
| 7,358,826 B2 * | 4/2008 | McCorquodale et al. | 331/179 |
| 7,558,036 B2 * | 7/2009 | Wardzala | 361/91.1 |
| 2002/0114184 A1 | 8/2002 | Gongwer et al. | |
| 2003/0048673 A1 | 3/2003 | Naso et al. | |
| 2004/0001379 A1 | 1/2004 | Azuma | |

\* cited by examiner

*Primary Examiner*—Viet Q Nguyen
(74) *Attorney, Agent, or Firm*—Knobbe, Martens, Olson & Bear, LLP (57) ABSTRACT

A storage subsystem includes a charge pump that receives a power signal from a host system, and generates a regulated power signal that is provided to the storage subsystem's controller. When the power signal from the host is interrupted, the charge pump additionally acts as a backup power supply to enable the storage subsystem to continue to operate temporarily, and power isolation circuitry in the storage subsystem prevents power from flowing back to the host system. The storage subsystem further includes a digitally programmable voltage detection circuit that accepts various supply voltages and asserts a busy signal to the controller when an anomaly in the power signal is detected. The controller includes logic circuitry that will block the host system from performing write operations to the storage subsystem either when the voltage detection circuit asserts a busy signal or when the controller is busy executing memory operation commands.

28 Claims, 4 Drawing Sheets

STORAGE SUBSYSTEM WITH EMBEDDED CIRCUIT FOR PROTECTING AGAINST ANOMALIES IN POWER SIGNAL FROM HOST

RELATED APPLICATION

This application relates to U.S. patent application Ser. No. 10/406,805, filed Apr. 3, 2003, entitled "Storage Subsystem with Embedded Circuit for Protecting Against Anomalies in Power Signal from Host," which has been issued as U.S. Pat. No. 6,856,556, and U.S. patent application Ser. No. 11/037,728, filed Jan. 18, 2005, entitled "Storage Subsystem with Embedded Circuit for Protecting Against Anomalies in Power Signal from Host," which has been issued as U.S. Pat. No. 7,126,857, the disclosures of which are hereby bodily incorporated by reference.

BACKGROUND

1. Technical Field

The present invention relates to storage subsystems. More specifically, the present invention relates to circuits for protecting storage subsystems from damage and data loss caused by irregularities in a power signal.

2. Description of the Related Art

A significant problem in the area of storage subsystems relates to data loss, data corruption, and circuitry damage caused by interruptions and other irregularities in the power signal supplied by the host system. For example, in the context of a flash memory subsystem, an unexpected power loss can cause a sector write operation to terminate prematurely, resulting in a mismatch between a sector's data and ECC portions. In addition to losing the write data, the storage subsystem's controller may thereafter respond to the ECC mismatch condition by treating the sector as defective, and unnecessarily replacing the sector with a spare sector. Incomplete sector write operations can also result in data loss and sector replacement in disk drives that store data on a rotating medium. Other types of power signal anomalies, such as power surges and spikes, can additionally cause permanent damage to the circuitry of the storage subsystem.

SUMMARY OF THE DISCLOSURE

Embodiments of the disclosure provide a system and associated method for protecting a storage subsystem from irregularities in a power signal supplied by a host system. In one embodiment, the storage subsystem includes a charge pump circuit that receives a power signal from a host system, and generates a regulated power signal that is provided to the storage subsystem's controller (and possibly to other active components of the storage subsystem). When the power signal from the host is interrupted, the charge pump circuit acts as a backup power source such that the storage subsystem can continue to operate temporarily.

Embodiments recognize that during a power anomaly that power tends to flow from the storage subsystem to the host system. Thus, in addition to providing backup power, in certain embodiments the charge pump circuit is configured to provide power isolation for the storage subsystem. When the power signal from the host is interrupted, the power isolation circuitry prevents the reverse flow of current towards the host system from the charge pump or backup power source in order to increase the continued operation time of the storage subsystem.

The storage subsystem in the preferred embodiments also includes a voltage detection circuit that monitors the power signal from the host system to detect anomalies. The voltage detection circuit responds to detection of a power signal anomaly by asserting a busy signal to block the host system from sending instructions for write operations to the storage subsystem. An embodiment of the storage subsystem additionally comprises one or more digitally controlled voltage dividers (DCVD) (for example, digital voltage potentiometers) that are controlled by the controller, so that the voltage provided to the voltage detection circuit can be adjusted. The storage subsystem may thus be programmably adaptable to different voltage supplies from the host without requiring modifications in the hardware of the storage subsystem. By asserting the busy signal, the voltage detection circuit substantially ensures that backup power provided by the charge pump (and by the battery and/or capacitive array, if provided) will be sufficient for the controller to complete most or all outstanding operations. The likelihood that data will be lost as a result of the power signal anomaly is therefore significantly reduced.

In another embodiment, the controller of the storage subsystem includes a ready/busy signal logic integrated as a part of the controller. When the voltage detection circuit detects a power signal anomaly, the ready/busy signal logic asserts a busy signal to block the host system from performing write operations to the storage subsystem. The ready/busy signal logic may be advantageously implemented in the controller as a software module.

BRIEF DESCRIPTION OF THE DRAWINGS

Specific embodiments of the invention will now be described with reference to the following drawings, which are intended to illustrate and not limit the invention.

DETAILED DESCRIPTION OF THE PREFERRED EMBODIMENTS

Embodiments may be embodied within a variety of different types of storage subsystems, including but not limited to non-volatile solid state memory cards (such as but not limited to those that comply with the CompactFlash, PCMCIA, SmartMedia, MultiMediaCard, SecureDigital and Memory Stick card specifications), volatile and non-volatile solid-state storage products in disk drive form factors, electromechanical disk drives, and volatile and non-volatile solid-state storage products in a variety of industry standard and custom form factors. No modifications to the host system are needed.

Figure 1:
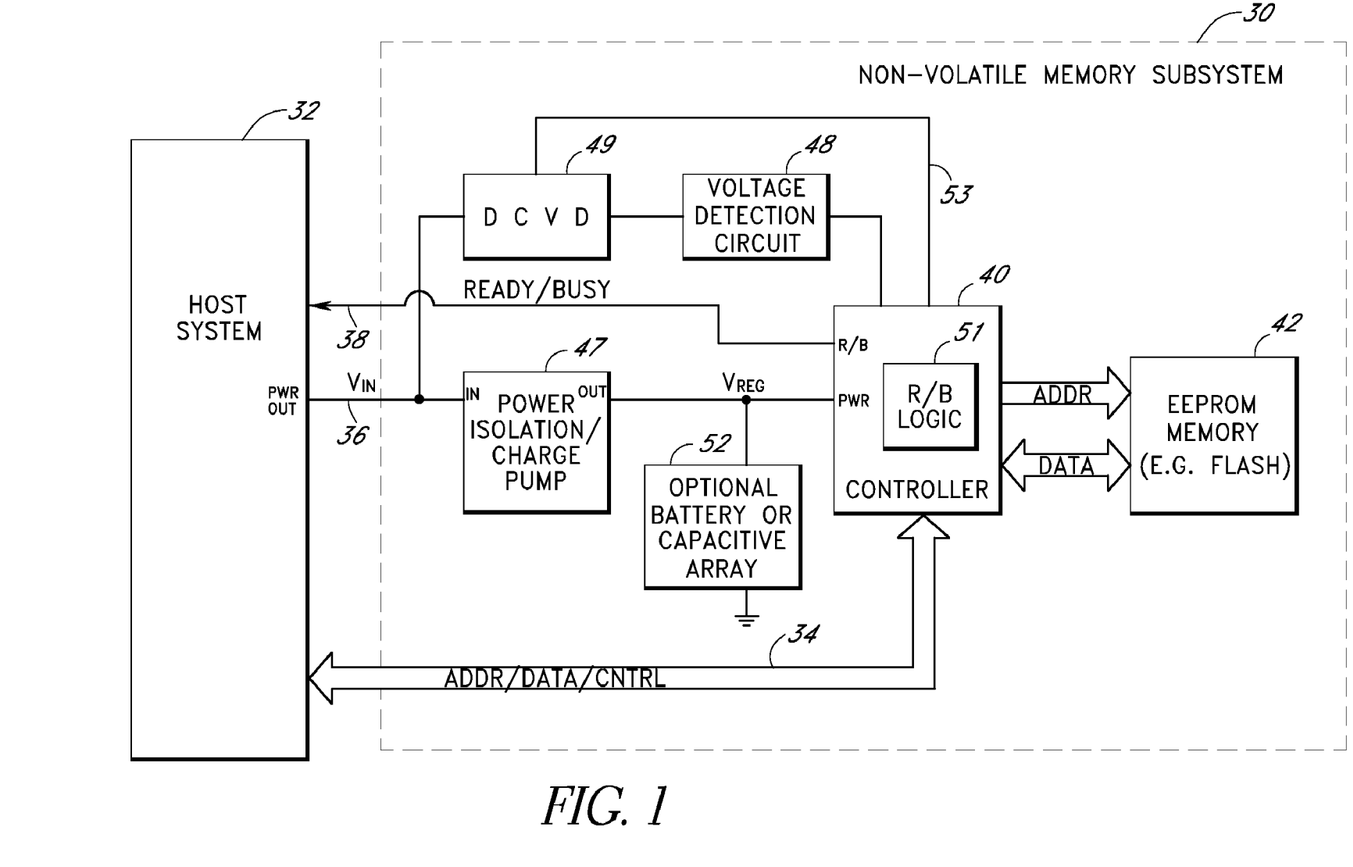
FIG. 1 illustrates the design of a non-volatile solid state storage subsystem according to one embodiment.

FIG. 1 illustrates a solid-state storage subsystem 30 according to one embodiment of the invention. The storage subsystem 30 may, for example, be a flash memory card that conforms to one of the aforementioned card specifications, although the invention is not so limited. The storage subsystem 30 plugs into a slot of, or otherwise attaches to, a host system 32 (hereinafter "host"). The host 32 may be any type of conventional computing system or device that accepts the storage subsystem, and need not include any special hardware or software for implementing the present invention.

The interface between the storage subsystem 30 and the host 32 includes the following conventional signal lines: a set of address/data/control lines 34 for transferring data; at least one power line 36 over which the host provides a power signal to the storage subsystem; and a ready/busy signal line 38 that is driven by the storage subsystem to notify the host 32 of the subsystem's current status. In implementations in which the particular interface does not include an actual "ready/busy" signal, a different signal or combination of signals may be used to notify the host 32 of the storage subsystem's ready/busy status.

The storage subsystem 30 includes a controller 40 that controls an array of solid-state, non-volatile memory 42, which may be flash memory or another type of EEPROM memory. A conventional flash memory controller 40 may be used, as no special controller circuitry or functionality is needed in the illustrated embodiment. In accordance with various embodiments, the storage subsystem 30 also includes the following components to protect against anomalies in the power signal supplied by the host 32: a power isolation circuit/charge pump 47, a voltage detection circuit 48, one or more digitally controlled dividers (DCVD) 49, and a ready/busy logic 51 integrated into the controller 40. In one embodiment the DCVD 49 may comprise one or more digitally controlled potentiometers. The ready/busy logic 51 can be a logical "OR" gate implemented in software or other types of gates and switches. The power isolation circuit/charge pump circuit 47, the voltage detection circuit 48, and/or the DCVD 49 may be integrated within a single analog application specific integrated circuit (ASIC), possibly together with other components of the memory subsystem. As depicted by block 52 in the drawing, an optional battery or capacitive array may also be included to provide an additional level of protection against power anomalies.

Power Isolation Circuit/Charge Pump

As illustrated in FIG. 1, the power isolation circuit/charge pump 47 receives the power signal $V_{IN}$ from the host 32, and supplies a regulated, substantially-constant power signal $V_{REG}$ to the controller 40—and possibly to other active components of the memory subsystem, such as a volatile memory used as a buffer (not shown). Preferably, the charge pump is designed such that the voltage $V_{REG}$ supplied to the controller 40 is maintained at an ideal level (e.g., 5.4 volts) in the event of a brief interruption, drop, increase, or spike in the voltage $V_{IN}$ supplied by the host 32. In addition, the power isolation circuit/charge pump 47 is preferably designed to protect against sustained voltage drops; for example, in one embodiment, the charge pump is capable of maintaining $V_{REG}$ at 5.4 volts indefinitely as long as $V_{IN}$ exceeds 0.7 volts. The power isolation circuit/charge pump 47 thus allows the memory subsystem 30 to continue to operate during certain types of power anomalies, including brief power interruptions, spikes and sustained voltage drops. In addition, the power isolation circuit/charge pump 47 protects the controller 40 from being damaged by spikes and surges in the power signal provided by the host 32.

The charge pump portion of the power isolation circuit/charge pump 47 preferably is or comprises a DC-to-DC step-up/step-down converter. Examples of commercially available charge pump devices that may be used include the ILC6363CIR50 and ILC6383CIRADJ from Fairchild and the MAX849 and MAX1705 from Maxim. The charge pump may optionally include or be followed by a low drop-out (LDO) voltage regulator (not shown) to provide greater output voltage stability. This LDO voltage regulator may be provided in-line between the charge pump's output and the controller's power input, downstream from the optional battery or capacitive array 52 if provided. One example of a voltage regulator device that may be used is a Seiko Epson 580827C.

Embodiments recognize that during a power anomaly that power tends to flow from the storage subsystem 30 to the host system 32. The power isolation/charge pump 47 additionally electrically isolates the storage subsystem 30 from the host system 32 in the event of a loss of power. When a power anomaly occurs, and in particular, a loss of power to the host system 32, a storage subsystem that does not include a power isolation circuit 47 may experience a reverse current drain towards the host system 32. For example, stored charge from the controller 40 or battery or capacitor array 52 may be diverted from the controller 40 to the host system 32, reducing the amount of time that the controller 40 and other circuitry of the storage subsystem 30 can operate after a power anomaly. The power isolation/charge pump 47 substantially prevents this reverse current drain in the event of a power anomaly. Therefore, more of the stored charge in the battery or capacitor array 52 or the controller 40 is available to the controller 40 or additional circuitry of the storage subsystem 30 to complete outstanding memory operations such as write commands to the memory 42. The controller 40 may thus remain active longer after a power anomaly and the likelihood of an error caused by lack of power to execute an outstanding command is decreased.

Voltage Detection Circuit

The voltage detection circuit 48 is responsible for detecting anomalies in the power signal $V_{IN}$ supplied by the host over line 36, and for driving the ready/busy signal to the "busy" state when such anomalies are detected. In one embodiment, a conventional voltage detection circuit may be used. The voltage detection circuit 48 may be designed to generate a "busy" signal whenever $V_{IN}$ falls below a certain level, such as 2.6 or 2.7 volts. The voltage detection circuit 48 may also be designed to generate a busy signal when the voltage exceeds a certain level, and/or when other types of anomalies are detected. To inhibit rapid transitions between the "ready" and "busy" states, the voltage detection circuit 48 may be designed to provide a degree of hysteresis, and/or to hold its output for a particular time period after a state transition.

In one embodiment, the storage subsystem 30 further includes the DCVD (digitally controlled voltage divider) 49 connected between the voltage $V_{IN}$ provided by the host system and the voltage detection circuit 48. The DCVD 49 is also connected to the controller 40 via control line 53. The controller 40 transmits control signals over control line 53 to the DCVD 49 in order to adjust the DCVD and therefore the supply voltage to the voltage detection circuit 48. Using the DCVD 49, the storage subsystem 30 may advantageously be programmed to adjust the input to the voltage detection circuit 48 in response to changes in the power supply voltage $V_{IN}$ provided by the host system 32. For example, while 5 V or 3.3 V may be a standard input voltage provided by a host system, some systems may provide 1.8 V as a supply voltage to the storage subsystem 30. By adjusting the voltage provided to the voltage detection circuit 48, the storage subsystem 30 may be programmably adaptable to different supply voltages without requiring modifications in the hardware of the storage subsystem 30.

Ready/Busy Logic

As shown in FIG. 1, storage subsystem 30 has the ready/busy logic 51 integrated into the controller 40. The output of the voltage detection circuit 48 is provided to the controller 40 and/or to the ready/busy logic 51 of the controller 40. The ready/busy logic 51 logically combines (e.g., ORs) the ready/busy signals generated by the voltage detection circuit 48 and the controller 40 to generate the ready/busy signal provided to the host 32 on line 38. Specifically, if a busy signal is generated by the voltage detection circuit 48 (indicating a power anomaly), by the controller 40, or by both the voltage detection and the controller, a busy signal is provided to the host 32. As is known in the art and defined by various interface specifications, the host will not perform new write operations to the storage subsystem when the "busy" state is asserted. Thus, the host 32 is prevented from performing write operations to the storage subsystem when voltage anomalies are detected and signaled by the voltage detection circuit 48. As mentioned above, in implementations in which the particular host-subsystem interface does not include a "ready/busy" signal, the ready/busy status of the storage subsystem 30 may be communicated to the host using a different signal line or combination of signal lines.

In another embodiment, the ready/busy logic 51 may be used in addition to standard ready/busy circuitry or software provided by the controller 40. As such, the ready/busy logic 51 sends a busy signal to the host 32 when either the controller 40 determines that it is busy processing data or when the ready/busy logic 51 receives a signal indicating that a power anomaly has occurred. By integrating the ready/busy logic 51 into the controller 40, the ready/busy logic 51 may be implemented in software. As software, the ready/busy logic 51 may further be configured by a host in order to adapt to existing operating conditions. Other advantages of implementing the ready/busy logic in software include more flexibility, such as determining/ignoring false power fluctuations, providing forewarning of potential power loss (such as multiple false power fluctuations), and implementation of additional functions in need of proper shutdown.

Responding to Power Signal Anomalies

The illustrated storage subsystem 30 responds to power signal anomalies generally as follows. Upon detecting the anomaly, the voltage detection circuit 48 generates a busy signal to the ready/busy logic 51 within the controller 40, which in turns causes the controller 40 to assert a busy signal to the host over line 38. The signal in turn causes the host to refrain from writing or reading data to/from the storage subsystem 30. Despite the anomaly in the power input signal, the power isolation circuit/charge pump 47 continues to provide a near-constant voltage $V_{REG}$ to the controller 40 (for at least a minimum time period $T_{VREG}$, as described below). Because new write operations are inhibited, and because the charge pump continues to provide a regulated power signal to the controller 40, the possibility of data corruption (e.g., as a result of incomplete write operations) is significantly reduced. The circuit/charge pump 47 also serves to protect the controller 40 and other circuitry from damage caused by voltage surges and spikes. Moreover, the circuit/charge pump 47 prevents the reverse flow of current towards the host system from the charge pump or backup power source in order to increase the continued operation time of the storage subsystem 30.

Even if the anomaly is in the form of a complete interruption or termination of power from the host 32, the power isolation circuit/charge pump 47 continues to provide power to the controller 40 (and possibly to other active components, as mentioned above) for at least the minimum time period, $T_{VREG}$, needed to complete most or all outstanding operations. For example, if a write operation is in progress and the storage subsystem 30 has write data stored in its volatile RAM buffer (not shown), backup power will be provided for a time period sufficient for the controller 40 to finish writing this data to the EEPROM memory 42, and if necessary, to back up any configuration data stored in volatile memory. The storage subsystem 30 may also use the backup power to perform a shut down sequence. The value of $T_{VREG}$ needed to protect against data loss will typically be in the range of several milliseconds to several seconds, depending upon the design and type of the storage subsystem 30.

As depicted by block 52 in FIG. 1, a battery or a capacitive array may be connected between ground and the output of the power isolation circuit/charge pump 47 to extend the time duration for which backup power is provided. If a battery is used, the battery may be a small, rechargeable, watch-type battery that is embedded within the storage subsystem's housing. Typically, a battery of this type can provide several minutes of backup power to the controller 40. If a capacitive array is provided, the capacitive array may comprise of a bank or array of capacitors, and may provide tens to thousands of micro-farads of capacitance. The battery or capacitive array, if provided, is connected so as to become or remain charged from the output of the power isolation circuit/charge pump 47.

The protection circuitry illustrated in FIG. 1 is particularly useful for protecting against power interruptions caused by the removal or movement of the storage subsystem 30 by the user. The protection circuitry also protects against power anomalies emanating from or experienced by the host, and may therefore also find utility in storage subsystems that are not intended to be removed by the user.

Figure 2:
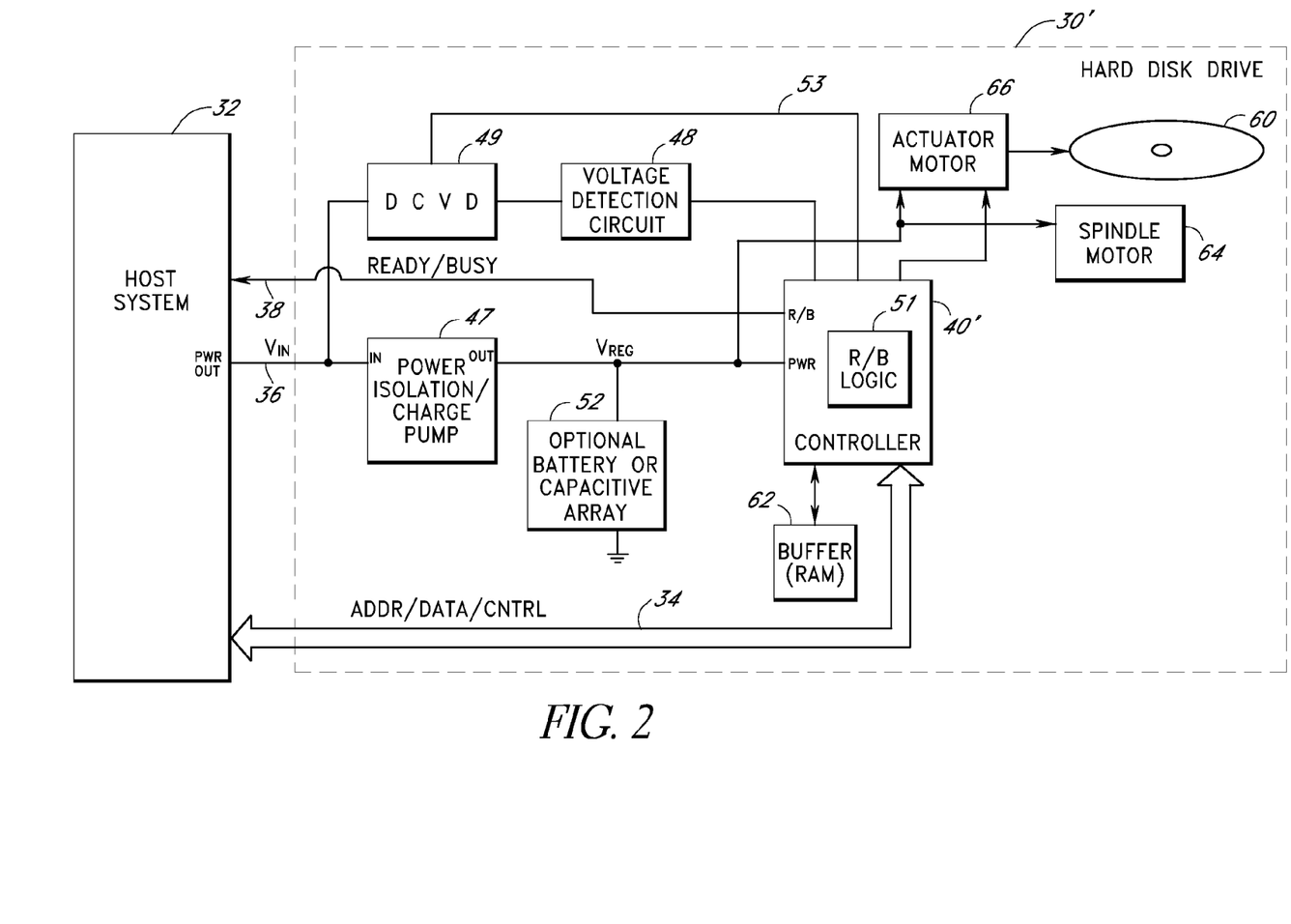
FIG. 2 illustrates the design of a hard disk drive subsystem according to another embodiment.

FIG. 2 illustrates an embodiment in which the power anomaly protection circuitry is included within a hard disk drive subsystem 30', such as an ATA, Serial ATA, SCSI, or Serial-Attached SCSI disk drive. In this embodiment, the controller 40' is a conventional disk drive controller that controls reads and writes of data to/from a rotating magnetic disk 60. In the illustrated embodiment, the controller 40' accesses a buffer or cache 62 formed from volatile solid state RAM. The design and operation of the power anomaly protection circuitry in this disk drive embodiment may be substantially the same as described with reference to FIG. 1, except that the power isolation circuit/charge pump 47 (and the optional battery or capacitive array 52) may also provide backup power to the spindle motor 64 and the actuator motor 66 of the disk drive 30'.

Figure 3:
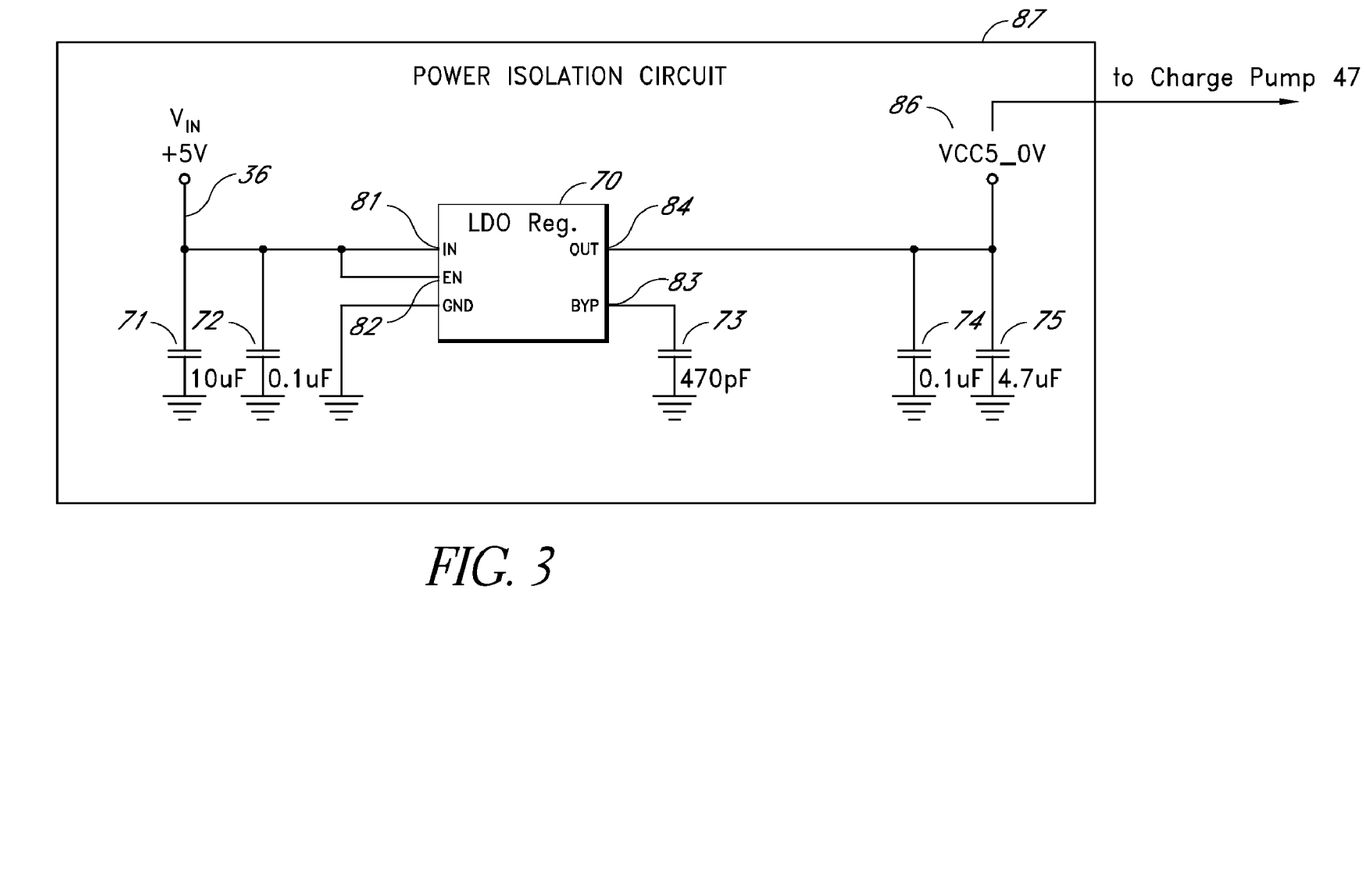
FIG. 3 illustrates the design of power isolation circuitry according to an embodiment.

FIG. 3 shows an illustration of the power isolation circuitry according to an embodiment. Power isolation circuitry 87 may be provided between a charge pump and power supply line from the host system 32. A low drop out (LDO) voltage regulator 70 is utilized to provide power isolation. In other embodiments, the power isolation circuitry 87 may use a diode, a Field-Effect Transistor (FET), an Opt-Isolator, etc. to accomplish the power isolation effect.

Power isolation circuitry 87 has a 5-volt input $V_{IN}$ over line 36. The input voltage $V_{IN}$ is connected to the input terminal 81 of the LDO voltage regulator 70. One or more input capacitors are connected between the input and ground. As shown in the example embodiment, input capacitors 71 and 72 respectively provide 10 μF and 0.1 μF of capacitance between the input and ground. Other capacitance values may be used as well to accommodate different voltage inputs. The input terminal 81 of the voltage regulator 70 further is connected to the enable terminal 82 in the embodiment shown. The reference bypass terminal 83 is connected to a 470 pF capacitor 73 in order to reduce output noise. One or more additional output capacitors are connected between the output and ground. As shown, output capacitors 74 and 75 respectively provide 0.1 μF and 4.7 μF of capacitance. The output is then connected to the charge pump 47.

Figure 4:
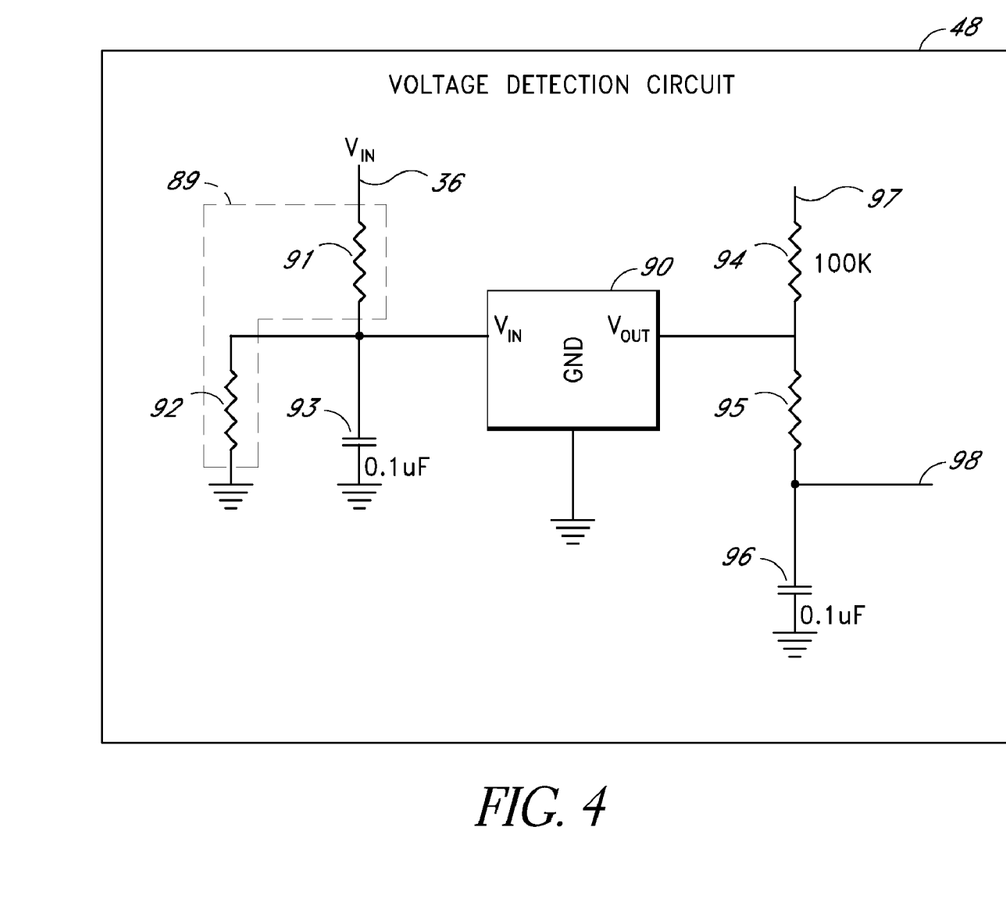
FIG. 4 illustrates the design of a voltage detection circuit according to another embodiment.

FIG. 4 shows a voltage detection circuit 48 according to an embodiment. The illustrated voltage detection circuit 48 includes a voltage detector 90. An input voltage $V_{IN}$ is provided from host system 32 over the line 36. The voltage input $V_{IN}$ is applied to a voltage divider 89 comprising resistors 91 and 92. Resistors 91 and 92 are each shown as having 1 kΩ resistance. However, as described above in conjunction with FIG. 3, resistors 91 and 92 may be digitally controlled, that is, replaced by an implementation of the DCVD 49 with two digitally controlled potentiometers. In that case, the values of resistors 91 and 92 may therefore be adjusted by the controller 40. In other embodiments, different values of resistance are used for the resistors 91 and 92. An input capacitor 93 may be optionally included in the voltage detection circuit 48, and if included, may be connected across the input to the voltage detector 90 and ground. Resistors 94 and 95 are provided at the output of voltage detector 90 as shown. Resistors 94 and 95 are each shown as having 100 kΩ resistance, though in other embodiments different values of resistance are used for the resistors 94 and 95. The output 98 of voltage detection circuit 48 provides a signal to the controller 40 as shown in FIGS. 1-2. The voltage detector 90 may be configured to provide an output voltage that is approximately equal to the input voltage when the input voltage is above a detection threshold level and an output voltage of approximately 0 (zero) volts when the input voltage is below a detection threshold level. This enables the controller 40 to determine if a power anomaly has occurred.

Although this invention has been described in terms of certain preferred embodiments and applications, other embodiments and applications that are apparent to those of ordinary skill in the art, including embodiments which do not provide all of the features and advantages set forth herein, are also within the scope of this invention. For example, the protection circuitry and methods of the present invention may also be incorporated into other types of storage subsystems, including volatile storage subsystems that store data within DRAM or SRAM. Accordingly, the scope of the present invention is intended to be defined only by reference to the appended claims.

What is claimed is:

1. A storage subsystem, comprising:
 a controller that writes data to, and reads data from, a non-volatile storage medium;
 a charge pump circuit that receives a power signal from a host system and generates a regulated power signal that is provided to the controller, wherein the charge pump circuit is capable of maintaining the regulated power signal to the controller when the power signal from the host system is interrupted;
 an isolation circuit that substantially prevents power in the controller from flowing back to the host system when the power signal from the host system is interrupted, whereby the power is preserved in the controller to complete outstanding memory operations; and
 a voltage detection circuit that monitors the power signal from the host system to detect anomalies therein, and responds to detection of such an anomaly by asserting a busy signal to the controller,
 wherein the controller further comprises a ready/busy logic circuit that asserts a busy signal to block the host system from performing write operations to the storage subsystem when either or both of the following occur: (a) the controller receives a busy signal from the voltage detection circuit; (b) a busy signal is generated by the controller as a result of a memory access operation.

2. The storage subsystem of claim 1 wherein the charge pump circuit and the voltage detection circuit are integrated within a single application specific integrated circuit (ASIC).

3. The storage subsystem of claim 1 wherein the voltage detection circuit holds its output for a particular time period.

4. A storage subsystem, comprising:
 a controller that writes data to, and reads data from, a non-volatile storage medium;
 a charge pump circuit that receives a power signal from a host system and generates a regulated power signal that is provided to the controller, wherein the charge pump circuit is capable of maintaining the regulated power signal to the controller when the power signal from the host system is interrupted;
 an isolation circuit that substantially prevents power in the controller from flowing back to the host system when the power signal from the host system is interrupted, whereby the power is preserved in the controller to complete outstanding memory operations, the isolation circuit comprising:
  a low dropout regulator;
  a voltage input connected to an input terminal and an enable terminal of the low dropout regulator; and
  at least one input capacitor connected between the voltage input and ground; and
 a voltage detection circuit that monitors the power signal from the host system to detect anomalies therein, and responds to detection of such an anomaly by asserting a busy signal to the controller.

5. The storage subsystem of claim 4 wherein the isolation circuit further comprises:
 a voltage output connected to an output terminal of the low dropout regulator;
 a reference bypass capacitor connected to a reference bypass terminal of the low dropout regulator; and
 at least one output capacitor connected between the voltage output and ground.

6. The storage subsystem of claim 1 wherein the isolation circuit further comprises a FET.

7. A storage subsystem, comprising:
 a controller that writes data to, and reads data from, a non-volatile storage medium;
 a charge pump circuit that receives a power signal from a host system and generates a regulated power signal that is provided to the controller, wherein the charge pump circuit is capable of maintaining the regulated power signal to the controller when the power signal from the host system is interrupted;
 an isolation circuit that substantially prevents power in the controller from flowing back to the host system when the power signal from the host system is interrupted, whereby the power is preserved in the controller to complete outstanding memory operations; and
 a voltage detection circuit that monitors the power signal from the host system to detect anomalies therein, and responds to detection of such an anomaly by asserting a busy signal to the controller,
 wherein the isolation circuit comprises an opt-isolator.

8. A storage subsystem, comprising:
 a controller that writes data to, and reads data from, a non-volatile storage medium;
 a charge pump circuit that receives a power signal from a host system and generates a regulated power signal that is provided to the controller, wherein the charge pump circuit is capable of maintaining the regulated power signal to the controller when the power signal from the host system is interrupted;

an isolation circuit that substantially prevents power in the controller from flowing back to the host system when the power signal from the host system is interrupted, whereby the power is preserved in the controller to complete outstanding memory operations; and a voltage detection circuit that monitors the power signal from the host system to detect anomalies therein, and responds to detection of such an anomaly by asserting a busy signal to the controller, the voltage detection circuit comprising:

a voltage detector;

a voltage input;

a voltage divider comprising at least one resistor, wherein the voltage divider is located between the voltage input and the voltage detector;

a input capacitor connected across the voltage input and to the voltage detector and ground; and at least one resistor connected between the voltage detector and a voltage output.

9. The storage subsystem of claim 8 wherein the voltage divider comprises a digitally controlled potentiometer.

10. The storage subsystem of claim 9 wherein the digitally controlled potentiometer is controlled by the controller, wherein the controller is configured to adjust the digitally controlled potentiometer according to a supply voltage used by the host system.

11. The storage subsystem as of claim 1, wherein the busy signal is provided on a ready/busy signal line used to inform the host system of whether the storage subsystem is ready to receive a next command.

12. The storage subsystem of claim 1, wherein ready/busy logic of the ready/busy circuit is implemented in hardware.

13. The storage subsystem of claim 1, wherein ready/busy logic of the ready/busy circuit is implemented in software.

14. A memory subsystem that protects against data losses caused by power signal anomalies, the memory subsystem comprising:

a solid state non-volatile memory array;

a controller that transfers data between a host system and the solid state non-volatile memory array, the controller comprising a logic unit;

a regulation circuit that receives a power signal from the host system, and generates a regulated power signal that is provided to the controller;

an isolation circuit that substantially prevents power in the controller from flowing back to the host system in the event of an anomaly in the power signal, whereby the power is preserved in the controller to complete outstanding memory operations; and a voltage detection circuit that monitors the power signal from the host system to detect anomalies therein, wherein the voltage detection circuit responds to detection of the anomaly in the power signal by causing a busy signal to be asserted to the logic unit of the controller, wherein the busy signal asserted to the logic unit causes the controller to assert a busy signal to the host system to block the host system from performing write operations to the memory subsystem during presence of the anomaly.

15. The memory subsystem of claim 14, wherein the isolation circuit further comprises a low dropout regulator.

16. The memory subsystem of claim 14, wherein the isolation circuit further comprises a FET.

17. A memory subsystem that protects against data losses caused by power signal anomalies, the memory subsystem comprising:

a solid state non-volatile memory array;

a controller that transfers data between a host system and the solid state non-volatile volatile memory array, the controller comprising a logic unit;

a regulation circuit that receives a power signal from the host system, and generates a regulated power signal that is provided to the controller;

an isolation circuit that substantially prevents power in the controller from flowing back to the host system in the event of an anomaly in the power signal, whereby the power is preserved in the controller to complete outstanding memory operations; and a voltage detection circuit that monitors the power signal from the host system to detect anomalies therein, wherein the voltage detection circuit responds to detection of the anomaly in the power signal by causing a busy signal to be asserted to the logic unit of the controller, wherein the isolation circuit comprises an opt-isolator.

18. A memory subsystem that protects against data losses caused by power signal anomalies, the memory subsystem comprising:

a solid state non-volatile memory array;

a controller that transfers data between a host system and the solid state non-volatile volatile memory array, the controller comprising a logic unit;

a regulation circuit that receives a power signal from the host system, and generates a regulated power signal that is provided to the controller;

an isolation circuit that substantially prevents power in the controller from flowing back to the host system in the event of an anomaly in the power signal, whereby the power is preserved in the controller to complete outstanding memory operations; and a voltage detection circuit that monitors the power signal from the host system to detect anomalies therein, wherein the voltage detection circuit responds to detection of the anomaly in the power signal by causing a busy signal to be asserted to the logic unit of the controller, the voltage detection circuit comprising a voltage divider.

19. The memory subsystem of claim 18 wherein the voltage divider comprises a digitally controlled potentiometer controlled by the controller, wherein the controller is configured to adjust the digitally controlled potentiometer according to a supply voltage used by the host system.

20. A method of responding to anomalies in a power signal provided by a host system to a storage subsystem, the method comprising, with the storage subsystem:

receiving the power signal from the host system, the host system being separate from the storage subsystem and pluggably connecting to the storage subsystem;

detecting an anomaly in the power signal with a detection circuit of the storage subsystem;

in response to detection of the anomaly by the detection circuit, asserting a signal to a controller of the storage subsystem to cause the controller to forward a signal to the host system to inhibit the host system from writing data to the storage subsystem during presence of the anomaly; and during the presence of the anomaly, substantially preventing power from being drained from the storage subsystem toward the host system with a power isolation circuit, whereby the power is preserved on the storage subsystem to complete outstanding memory operations.

21. The method of claim 20, wherein the storage subsystem is a solid state non-volatile memory card.

22. The method of claim 20, wherein the storage subsystem is a disk drive.

23. The method of claim 20, wherein the signal is a busy signal used to notify the host system that the storage subsystem is currently in a busy state.

24. The method of claim 20, wherein the signal is provided to the host system on a ready/busy signal line of a standard card interface that interconnects the host system and the storage subsystem.

25. The method of claim 20, wherein the signal is generated by a logic circuit in the controller that generates the signal when either or both of the following occur: (a) an anomaly is detected by the detection circuit; (b) a busy signal is generated by a controller of the storage subsystem.

26. The method of claim 20, wherein the anomaly is a termination of power from the host system.

27. The method of claim 26, wherein the method further comprises the storage subsystem responding to the termination of power by using at least one source of backup power of the storage subsystem to perform a shut down sequence.

28. The method of claim 20, wherein, by asserting the signal to the host system, the storage subsystem additionally inhibits the host system from reading data from the storage subsystem.

* * * * *